(12) United States Patent
Lin et al.

(10) Patent No.: US 10,361,710 B2
(45) Date of Patent: Jul. 23, 2019

(54) RECONFIGURABLE ETHERNET RECEIVER AND AN ANALOG FRONT-END CIRCUIT THEREOF

(71) Applicant: NXP B.V., Eindhoven (NL)

(72) Inventors: Yu Lin, Utrecht (NL); Marcello Ganzerli, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/031,988

(22) Filed: Jul. 10, 2018

(65) Prior Publication Data

US 2019/0181872 A1    Jun. 13, 2019

(30) Foreign Application Priority Data

Dec. 12, 2017    (EP) .................................... 17206786

(51) Int. Cl.

| H03M 1/12 | (2006.01) |
|---|---|
| H03M 1/00 | (2006.01) |
| H04B 1/3805 | (2015.01) |
| H03M 1/16 | (2006.01) |
| H04B 1/401 | (2015.01) |
| H03M 1/18 | (2006.01) |

(52) U.S. Cl.
CPC ........... *H03M 1/007* (2013.01); *H03M 1/121* (2013.01); *H03M 1/1245* (2013.01); *H03M 1/164* (2013.01); *H04B 1/3805* (2013.01); *H04B 1/401* (2013.01); *H03M 1/12* (2013.01); *H03M 1/18* (2013.01)

(58) Field of Classification Search
CPC ........... H03M 1/12; H03M 1/18; H03M 1/10; H03M 1/001

USPC ................................. 341/155, 139, 120, 110
See application file for complete search history.

(56) References Cited

U.S. PATENT DOCUMENTS

| 5,715,287 A | 2/1998 | Wadhawan et al. |
| 6,646,595 B1 | 11/2003 | Heng et al. |
| 6,864,822 B2 | 3/2005 | Golati et al. |
| 6,980,148 B1 | 12/2005 | Bahai |
| 7,587,224 B2 | 9/2009 | Zolfaghari |
| 8,598,906 B2 | 12/2013 | Van Der Goes et al. |

(Continued)

FOREIGN PATENT DOCUMENTS

| EP | 1125401 B1 | 6/2005 |
| WO | 0027079 A1 | 5/2000 |

OTHER PUBLICATIONS

"Automotive Ethernet: An Overview", ixia, 20 pgs. retrieved from the internet Mar. 18, 2019 at: https://support.ixiacom.com/sites/default/files/resources/whitepaper/ixia-automotive-ethernet-primer-whitepaper_1.pdf (May 2014).

*Primary Examiner* — Joseph J Lauture
(74) *Attorney, Agent, or Firm* — Rajeev Madnawat (57) ABSTRACT

The present application relates to a reconfigurable analog front-end circuit and a reconfigurable Ethernet transceiver with a reconfigurable analog front-end circuit. The circuit is reconfigurable using the at least one signal-path switching element controlled by a mode signal to operationally establish a first or a second signal path. The first signal path comprises an optional first signal-conditioning section and a shared ADC. The second signal path comprises an optional second signal-conditioning section, an upstream ADC and the shared ADC. The signal paths are selectively switched in response to a mode signal.

16 Claims, 6 Drawing Sheets

(56) References Cited

U.S. PATENT DOCUMENTS

| | | |
|---|---|---|
| 8,779,963 B1 | 7/2014 | Bales |
| 9,397,683 B2 * | 7/2016 | Nyshadham ............ H03M 1/12 |
| 9,595,974 B1 | 3/2017 | Pereira et al. |
| 2008/0055130 A1 * | 3/2008 | Sayers .................. H03M 1/188 |
| | | 341/139 |
| 2012/0026407 A1 | 2/2012 | Zhang et al. |
| 2018/0331853 A1 * | 11/2018 | Fredriksson ............ H04L 12/40 |

* cited by examiner

RECONFIGURABLE ETHERNET RECEIVER AND AN ANALOG FRONT-END CIRCUIT THEREOF

CROSS-REFERENCE TO RELATED APPLICATIONS

This application claims the priority under 35 U.S.C. § 119 of European Patent application no. 17206786.0, filed on Dec. 12, 2017, the contents of which are incorporated by reference herein.

FIELD OF THE INVENTION

The present disclosure relates generally to reconfigurable Ethernet transceiver. In particular, the present disclosure relates to a reconfigurable analog front-end of a receiver section of an Ethernet transceiver.

BACKGROUND

The bandwidth requirements of modern and future automotive applications are posing a relevant challenge to current in-vehicle networking, IVN, technologies such as Controller Area Network (CAN) and FlexRay. Thanks to the latest development of the Ethernet technology, a 100 Mbps Ethernet link can now be implemented and in near future a 1000 Mbps/1 Gbps Ethernet link will be implementable on an unshielded twisted pair of copper wires while limiting the EMI emissions below the threshold imposed by the regulatory automotive standards. The 100 Mbps Ethernet link over an unshielded twisted pair of copper wires is also referred to as 100Base-T1 and the 1000 Mbps/1 Gbps Ethernet link over an unshielded twisted pair of copper wires is also referred to as 1000Base-T1.

Ethernet is a point-to-point communication technology. More complex networks are created by using layer 2 (according to the ISO/OSI stack) bridges (also called switches). Switches enable the definition of complex network topologies and offer many services including the basic relying of frames (the basic Ethernet communication element) from one source node to multiple destinations, and more complex operations such as channel bandwidth allocation, network partitioning via virtual LANs (VLANs) and traffic prioritization. Switched Ethernet networks have been implemented in the automotive market for supporting bandwidth-intensive applications such as infotainment and surround-view applications.

The coming 1 Gbps Ethernet link will allow to interconnect further domains of automotive electronic units including for example powertrain domain, chassis domain, body and comfort domain and driver assistance and safety domain.

It is expected that switched 1 Gbps Ethernet link will be used for a backbone interconnecting different domains whereas within each of the domains 100 Mbps Ethernet links and 1000 Mbps/1 Gbps Ethernet links will be used dependent on the bandwidth requirement. Hence, 100 Mbps Ethernet links and 1000 Mbps/1 Gbps Ethernet links are expected to coexist.

Accordingly, there is a need for Ethernet transceivers supporting both 100 Mbps Ethernet links and 1000 Mbps/1 Gbps Ethernet links meeting the constraints of power efficiency and cost effectiveness.

SUMMARY

The present invention provides a reconfigurable Ethernet transceiver and an analog front-end circuit thereof as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
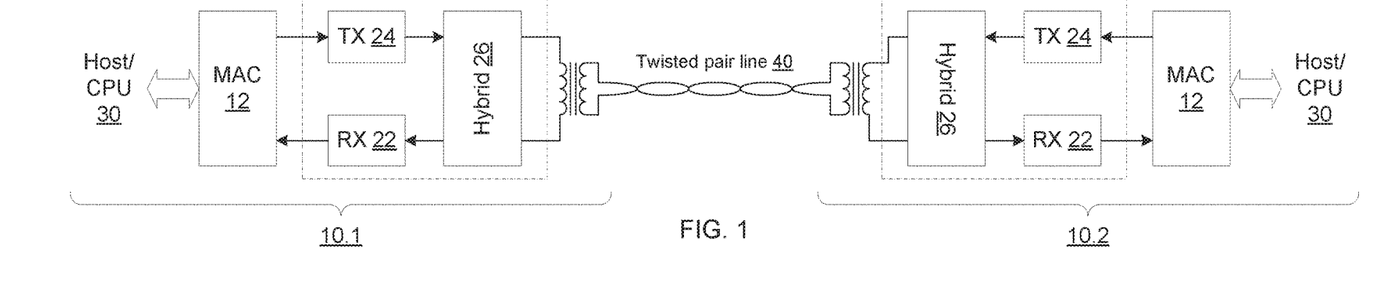
FIG. 1 schematically illustrates a block diagram of a communication system with two link partners.

FIG. 1 schematically shows a block diagram illustrating an exemplary Ethernet communication system over twisted-pair cabling link 40 between two link partners 10.1 and 10.2 for data traffic. Referring to FIG. 1, there is shown a system that comprises a link partner 10.1 and a link partner 10.2. Each of the link partners 10.1 and 10.2 may comprise a host processor 30, a medium access control (MAC) controller 12, and a transceiver 20. Notwithstanding, the invention is not limited in this regard.

The link partners 10.1 and 10.2 communicate via a cable. The cable may be a one-pair unshielded twisted-pair (UTP) copper cabling, for example. Certain performance and/or specifications criteria for UTP copper cabling have been standardized.

The transceiver 20 may comprise suitable logic, circuitry, and/or code that may enable Ethernet communication, such as transmission and reception of data, for example, between the link partners 10.1 and 10.2, for example. In this regard, the transceiver 20 may enable transmission at a low data rate and at a high data rate to and reception from the transceiver 20 of the respective link partner.

The data transmitted and/or received by the transceivers 20 may be formatted in a manner that may be compliant with the well-known OSI protocol standard, for example. The OSI model partitions operability and functionality into seven distinct and hierarchical layers. Generally, each layer in the OSI model is structured so that it may provide a service to the immediately higher interfacing layer. For example, layer 1, or physical (PHY) layer, may provide services to layer 2 and layer 2 may provide services to layer 3. In this regard, the transceiver 20 may enable PHY layer operations that are utilized for data communication with the respective link partner.

The transceivers 20 may enable multi-rate communications. In this regard, the data rate in the upstream and/or the downstream direction may be 100 Mbps, and/or 1000 Mbps (or 1 Gbps), for example. The transceivers 20 may support asymmetric data rates. The transceivers 20 may utilize multiple signaling in their operation.

The transceivers 20 may be configured to handle all the physical layer requirements, which may include, but are not limited to, packetization, data transfer and serialization/deserialization (SERDES), in instances where such an operation is required. Data packets received by the transceivers 20 from the respective MAC controllers 12 may include data and header information e.g. for each of the above functional layers. The transceivers 20 may be configured to encode data packets that are to be transmitted over the cable 40 and/or to decode data packets received from the cable 40.

The transceiver 20 includes a transmitter section 24 that receives digital data for transmission over the transmission channel. The transceiver 20 also includes a receiver section 22 that receives data from the transmission channel.

Each transceiver 20 includes a digital to analog converter (DAC) functionality as part of the transmitter section 24 for data transmission, and an analog to digital converter (ADC) functionality as part of the receiver section 22 for data reception. The hybrid circuit 26 is designed to reduce the level the transmit signal present in the receive signal path. The transmitter section 24 and the receiver section 22 are connected to the common twisted pair cabling 40.

The MAC controller 12 may comprise suitable logic, circuitry, and/or code that may enable handling of data link layer, layer 2, operability and/or functionality in the link partner. The MAC controllers 12 may be configured to implement Ethernet protocols, such as those based on the IEEE 802.3 standard and related derived standard(s), for example.

The MAC controller 12 may communicate with the transceiver 20 via an interface and with the host processor 30 via a bus controller interface. The interface between the MAC controller 12 and the transceiver 20 may correspond to Ethernet interface that comprise protocol and/or link management control signals and/or may be a multi-rate interface. The bus interface between the MAC controller 12 and the host processor 30 may correspond to a bus interface known in the field of processing systems such as a PCIe interface. Notwithstanding, the invention is not limited in this regard.

Figure 2A:
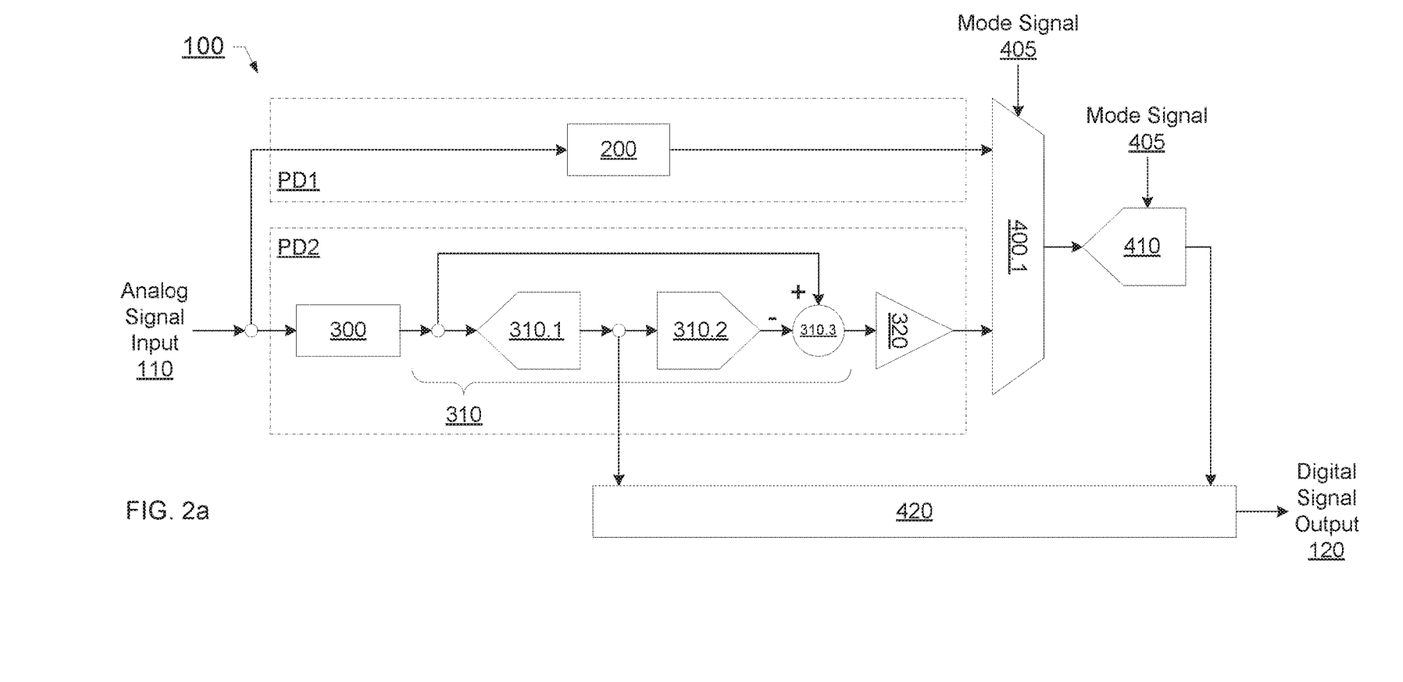
FIG. 2a schematically illustrates a block diagram of an analog front-end (AFE) of a receiver section of an Ethernet transceiver according to an example of the present invention.
Figure 2B:
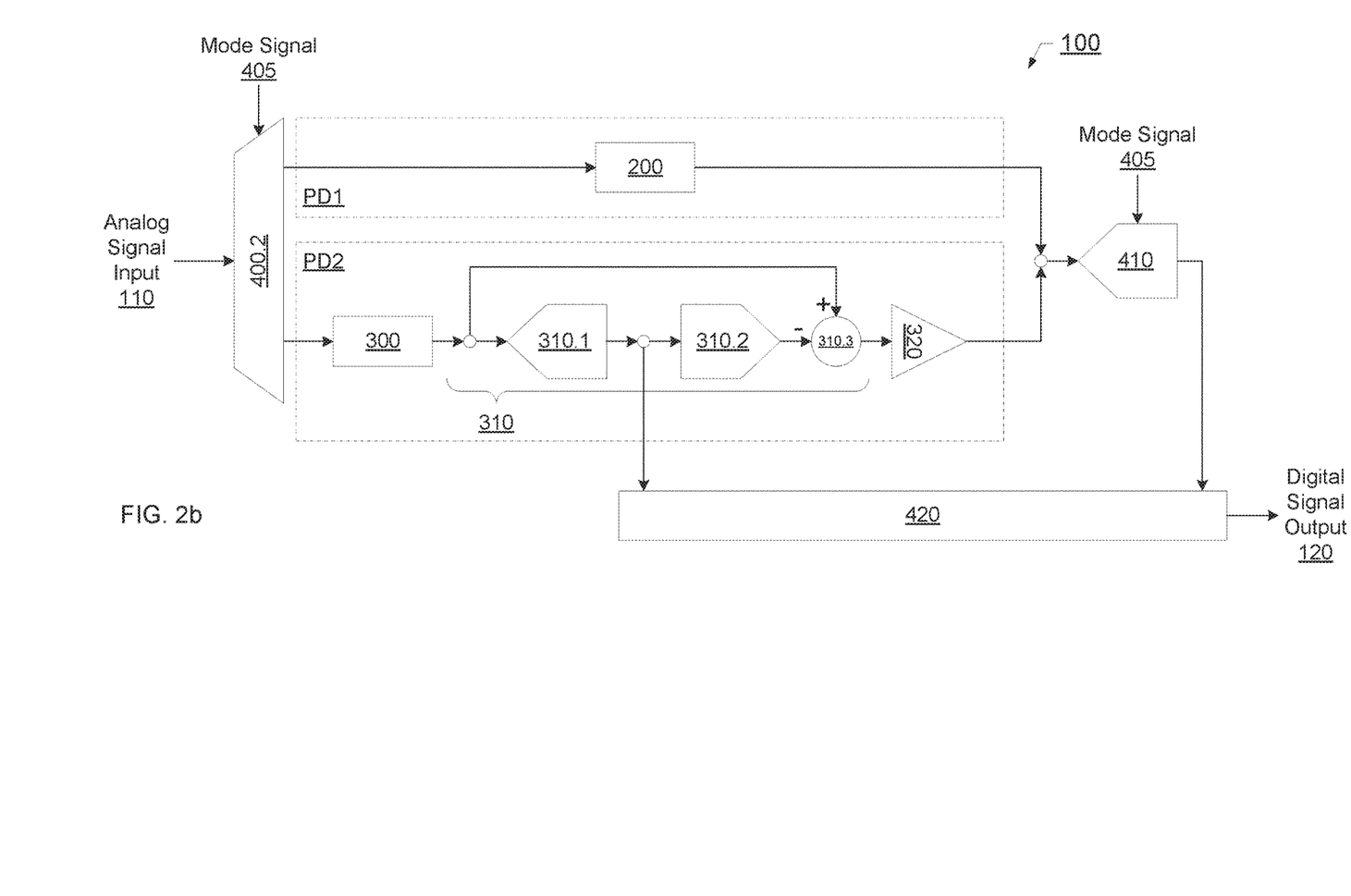
FIG. 2b schematically illustrates a block diagram of an analog front-end (AFE) of a receiver section of an Ethernet transceiver according to another example of the present invention.

FIGS. 2a and 2b schematically show block diagrams of analog front-ends (AFE) of a receiver section of an Ethernet transceiver according to embodiments of the present application. The exemplary analog front-ends, AFE, of the receiver section provide the analog-to-digital functionality to convert analog signals transmitted over the cable 40 to digital signals, which are further processed at a digital back end of the receiver section.

Referring first to FIG. 2a, the analog front-end, AFE, 100 comprises at least two selectively switched signal paths for processing an analog input signal supplied to a signal input 110 received from a hybrid circuit. The signal paths are selectively switched on the basis of a mode signal 405. The mode signal 405 comprises at least a low data rate, LDR, mode and a high data rate, HDR, mode corresponding to a first, low data rate, signal path and a second, high data rate, signal path. The first and second signal paths are signal processing paths.

The first signal path, which is the first, low data rate, signal path, comprises a first signal-conditioning section 200 and a shared analog-to-digital converter (ADC) 410 with an output for digital signals.

The second signal path, which is the second, high data rate, signal path, comprises a second signal-conditioning section 300, an upstream analog-to-digital converter (ADC) 310 with an output for digital signals and an output for residual signals, a residual signal amplifier 320 and the shared ADC 410.

In general, the digital signal output by an ADC is a digital representation of its input analog signal. The digital representation is typically an integer value that can range from 0 to $2^B-1$, where B is an exemplary bit resolution of the ADC.

With regard to the ADC, a residual signal is a residual voltage obtained by measuring the difference between the input analog signal and the digital-to-analog converter (DAC) output signal predicted by the digital signal. The residual signal is a consequence of the quantization or bit resolution of the ADC and is also referred to as quantization error. The residual error/quantization error is defined as the difference between the actual analog signal input to an ADC and the back converted analog signal generated by the DAC.

As illustratively shown in FIG. 2a, the upstream ADC 310 may comprise an ADC sub-section 310.1, a DAC sub-section 310.2 and an analog signal subtractor sub-section 310.3. The ADC sub-section 310.1 is provided to generate and output a digital signal representative of the actual analog signal input thereto. The DAC sub-section 310.2 has a similar resolution as the ADC sub-section 310.1 is provided to convert the generated digital signal into a back-converted analog signal, which is supplied to the subtractor sub-section 310.3.

This back-converted analog signal is subtracted at the subtractor sub-section 310.3 from the actual analog signal (on the basis of which the digital signal has been generated) giving the residual error signal representative of the quantization error produced by the ADC sub-section 310.1 and the DAC 310.2 due to the limited resolution and circuits nonidealities.

Notwithstanding, the invention is not limited in this regard. Those skilled in the art will understand that the implementation of the upstream ADC 310 shown herein is exemplary and illustrative to facilitate the understanding of the teaching of the present application.

The resulting residual (error) signal is scaled by a gain factor at the residual signal amplifier 320. In particular, the gain factor of the residual signal amplifier 320 is predefined. The gain factor may have a value of $2^{(B-1)}$, where B is the bit resolution of the upstream ADC 310. The scale factor is used to scale the residual signal to the full operating range of the shared ADC 410. Selecting the gain as a power of two may simplify the digital correction logic, which will be discussed below.

The digital signals output by the shared ADC 410 and/or the upstream ADC 310 are collected in a digital combination and correction section 420, which is used to combine the received digital signals into an output digital signal forming the final representation of the analog input signal. The output digital signal is provided by the digital combination and correction section 420 for further processing in the digital back end of the receiver section of the Ethernet transceiver.

The exemplary analog front-end implementation shown in FIG. 2a comprises further a signal-path switching element, which enables to selective switch between the first signal path and second signal path. The signal-path switching element is controlled by the mode signal 405 and selectively switches based thereon. The mode signal 405 is indicative of at least two different modes including the first, low data rate, mode and the second, high data rate, mode. The mode signal is indicative of either one of the modes. The different modes are mutually exclusive.

In response to the mode signal 405 indicative of the first, low data rate, mode, the signal-path switching element couples the first signal-conditioning section 200 to the shared ADC 410 such that the first, low data rate, signal path is established. In response to the mode signal 405 indicative of the second, high data rate, mode, the signal-path switching element couples the residual signal amplifier 320 to the shared ADC 410 such that the second, high data rate, signal path is established. As shown in FIGS. 2a, a 2 to 1 multiplexer 400.1 controlled by the mode signal 405 may be used as the signal-path switching element for selectively switching the first and second signal paths.

Referring now to FIG. 2b, exemplary analog front-end implementation shown therein differs from the exemplary analog front-end implementation of FIG. 2a from the arrangement of the signal-path switching element. The signal-path switching element is arranged at the analog signal input of the exemplary analog front-end implementation of FIG. 2b.

In response to the mode signal 405 indicative of the first, low data rate, mode, the signal-path switching element couples the analog signal input 110 to the first signal-conditioning section 200 such that the first, low data rate, signal path is established. In response to the mode signal 405 indicative of the second, high data rate, mode, the signal-path switching element couples analog signal input 110 into the upstream ADC 310 such that the second, high data rate, signal path is established. As shown in FIGS. 2b, a 1 to 2 multiplexer 400.2 controlled by the mode signal 405 may be used as the signal-path switching element for selectively switching the first and second signal paths.

Those skilled in the art will immediately understand from the above discussion that further different implementations of one or more signal-path switching elements may be applicable to selectively switch between the above described signal paths, along which analog signals received at the input 110 of the analog front-end, AFE, are processed to obtain digital signals representative of the input analog signals. The present invention is not limited to the exemplary analog front-end implementations shown in FIGS. 2a and 2b. In particular, the signal-conditioning section 200 may correspond to a programmable signal conditioning stage as described below to FIGS. 4, 5a and 5b. In an example, the signal-conditioning section 200 may comprise be a filter, an anti-alias receive filter or a bandpass input filter, which is in particular tunable.

Figure 3A:
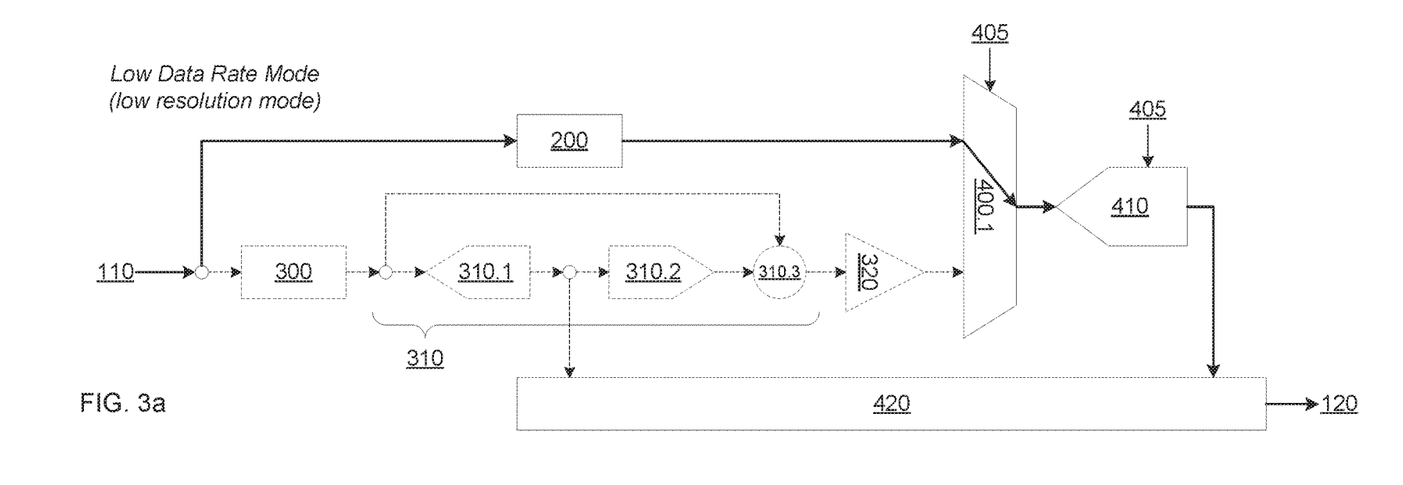
FIGS. 3a and 3b schematically illustrate block diagrams of the exemplary analog front-end, AFE, of FIG. 2a operated in different modes according to another example of the present invention.
Figure 3B:
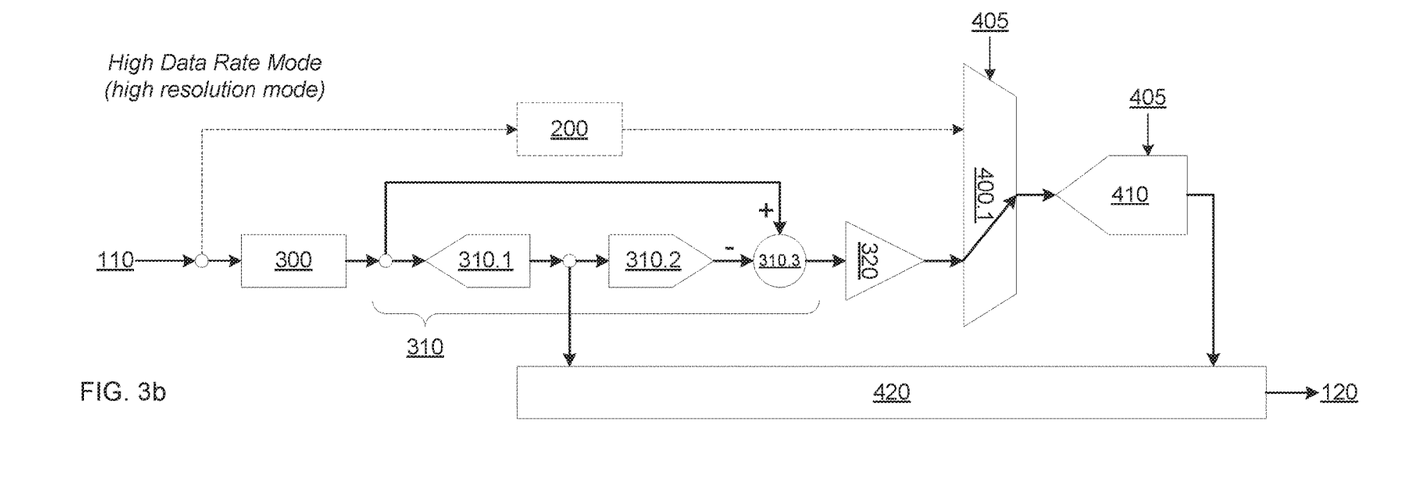

Referring now to FIGS. 3a and 3b, the switched signal paths are schematically illustrated with respect to the example implementation of FIG. 2a. Notwithstanding, the invention is not limited in this regard. Those skilled in the art will immediately appreciate that the switched signal paths are switchable obtainable in conjunction with the example implementation of FIG. 2b.

Referring now to FIG. 3a, the signal-path switching element, herein the 2 to 1 multiplexer 400.1, is controlled to operationally establish (activate) the flow of the analog input signal along the first, low data rate, signal path. Based on the mode signal 405, the signal-path switching element is controlled to couple the first signal-conditioning section 200 to the downstream-arranged shared ADC 410.

The analog input signal supplied to the analog signal input 110 flows along the first signal path to the first signal-conditioning section 200 in accordance with the switching state of the signal-path switching element. At the same time, the signal-path switching element decouples the residual amplifier 320 from the shared ADC 410, thereby deactivating the second, high data rate, signal path.

The first signal-conditioning section 200 is arranged to control the signal swing at the input of the downstream-arranged shared ADC 410. The first signal-conditioning section 200 comprises for instance a filter and/or an input amplifier. In particular, the filter may be a low bandwidth anti-alias receive filter or a bandpass input filter and/or the input amplifier may be a programmable gain input amplifier, PGA. The first signal-conditioning section 200 is in particular adapted for conditioning 100Base-T1 conform analog signals received at the analog signal input 110.

The conditioned analog input signal is supplied to the shared ADC 410. In accordance with the mode signal 405, the shared ADC 410 is controlled to operate at a low sampling frequency corresponding to a low data rate signal. In particular, the sampling frequency of the shared ADC 410 is controlled to match with the rate of symbols carried by the analog input signal. The symbol rate is dependent on the bit coding and the bit rate. In case of 100Base-T1 conform analog signals the sampling frequency of the shared ADC 410 is controlled at a sampling frequency of 80 MSps, mega-samples per second, to meet the 66⅔ MHz symbol transmission rate of 100Base-T1 conform analog signals.

The digital signal output by the shared ADC 410 is a digital representation of an actual conditioned analog input signal processed on the first, low data rate, signal path. The digital signal is supplied by the shared ADC 410 to the digital combination and correction section 420, which in case of the mode being in the low data rate mode is arranged to buffer the digital signal for forwarding to the digital back end of the receiver section of the Ethernet transceiver for further processing thereat.

As already mentioned above, the second, high data rate, signal path is deactivated. Accordingly, the components arranged only with the second, high data rate, signal path can be unpowered because they are not required for the operation of the analog front-end 100 in the current low data rate mode. In particular, the second signal-conditioning section 300, the upstream ADC 310 and the residual amplifier 320, which are arranged in the power domain PD2, are unpowered for power consumption efficiency.

Referring now to FIG. 3b, the signal-path switching element, herein the 2 to 1 multiplexer 400.1, is controlled to operationally establish (activate) the flow of the analog input signal along the second, high data rate, signal path. Based on the mode signal 405, the signal-path switching element is controlled to couple the residual amplifier 320 to the downstream-arranged shared ADC 410.

The analog input signal supplied to the analog signal input 110 flows along the second signal path to the second signal-conditioning section 300 in accordance with the switching state of the signal-path switching element. At the same time, the signal-path switching element decouples the first signal-conditioning section 200 from the shared ADC 410, thereby deactivating the first, low data rate, signal path.

The second signal-conditioning section 300 is arranged to control the signal swing at the input of the upstream ADC 310. The second signal-conditioning section 300 comprises for instance a filter and/or an input amplifier.

In particular, the filter may be a high bandwidth anti-alias receive filter or a low-pass input filter, LPF, and/or the input amplifier may be a programmable gain input amplifier, PGA.

The second signal-conditioning section 300 is in particular adapted for conditioning 1000Base-T1 conform analog signals received at the analog signal input 110.

The conditioned analog input signal is supplied to the upstream ADC 310. The upstream ADC 310 is configured to operate at a high sampling frequency corresponding to a high data rate signal. In particular, the sampling frequency of the upstream ADC 310 is configured to match with the rate of symbols carried by the analog input signal. The symbol rate is dependent on the bit coding and the bit rate. In case of 1000Base-T1 conform analog signals the sampling frequency of the shared ADC 410 is configured at a sampling frequency of 800 MSps, mega-samples per second, to meet the 750 MHz symbol transmission rate of 1000Base-T1 conform analog signals.

The residual error signal output by the upstream ADC 310 is supplied to the residual amplifier 320, which amplifies the residual error signal. The gain of the residual amplifier 320 is configured to amplify the residual error signal to be in correspondence with the signal input range of the shared ADC 410.

The amplified residual error signal is supplied to the shared ADC 410. In accordance with the mode signal 405, the shared ADC 410 is controlled to operate at the high sampling frequency corresponding to the high data rate signal. In particular, the sampling frequency of the shared ADC 410 is controlled to match with the rate of symbols carried by the analog input signal. In case of 1000Base-T1 conform analog signals the sampling frequency of the shared ADC 410 is controlled at a sampling frequency of 800 MSps, mega-samples per second, to meet the 750 MHz symbol transmission rate of 1000Base-T1 conform analog signals.

The digital signals output by the upstream ADC 310 and the shared ADC 410 are digital representations of an actual conditioned analog input signal processed on the second, high data rate, signal path. The digital signals are supplied by the upstream ADC 310 and the shared ADC 410 to the digital combination and correction section 420, which in case of the mode being in the high data rate mode is arranged to combine the digital signals to one digital signal representative of the actual analog input signal. The digital combination and correction section 420 may multiply the digital signal received from the upstream ADC 310 according to the gain factor applied by the residual amplifier 320.

The digital combination and correction section 420 may be arranged to consider a time delay when combining the digital signals determined from the actual analog input signal by the upstream ADC 310 and the shared ADC 410.

The digital combination and correction section 420 may be further arranged to apply error correction mechanism(s) to the digital signals received from the ADCs 310 and 410. For instance, the gain factor applied by the residual amplifier 320 is selected to obtain overlapping output values ranges e.g. one, two or more bits. An overlap enables the digital combination and correction section 420 to detect and correct errors.

The digital signal generated by digital combination and correction section 420 on the basis of the digital signals (received from the upstream ADC 310 and the shared ADC 410 in case of the mode being in the high data rate mode) is further forwarded to the digital back end of the receiver section of the Ethernet transceiver for further processing thereat.

As already mentioned above, the first, low data rate, signal path is deactivated. Accordingly, the components arranged only with the first, low data rate, signal path can be unpowered because they are not required for the operation of the analog front-end 100 in the current high data rate mode. In particular, the first signal-conditioning section 200, which is arranged in the power domain PD1, is unpowered for power consumption efficiency.

The analog front-end (AFE) implementations illustrated above with respect to FIGS. 2a and 2b are in particular applicable for automotive Ethernet transceivers.

For automotive purpose, 100Base-T1 and 1000Base-T1 Ethernet transceivers have been introduced or are specified for introduction. The 100Base-T1 and 1000Base-T1 Ethernet transceivers are covered by IEEE 802.3 standards and in particular IEEE 802.3 bp, IEEE 802.3bw and related standards. Both 100Base-T1 and 1000Base-T1 Ethernet transceivers support signal transmission over copper-based, single twisted pair cables up to a length of 15 meters. Three-level pulse amplitude modulation (PAM-3) coding is used. The different transfer rates are obtained by different symbol frequencies.

For conditioning the analog signals, the signal-conditioning sections 200 and 300 may be specifically configured for 100Base-T1 and 1000Base-T1 conform analog signals, respectively. In particular, a filter comprised by the first signal-conditioning section 200 may be configured to meet a frequency range specified for 100Base-T1 conform analog signals and a filter comprised by the second signal-conditioning section 300 may be configured to meet a frequency range specified for 1000Base-T1 conform analog signals. Filter characteristics of such respective filters comprises passband, stopband and transition characteristics between the passband and stopband.

The different symbol frequencies are considered in that the shared ADC 410 has a configurable sampling frequency.

For sampling the low frequency 100Base-T1 conform analog signals, the sampling frequency of the shared ADC 410 is accordingly configured, e.g. in response to the mode signal 405 indicative of the low data rate mode. The shared ADC 410 arranged to meet the meet the required time and voltage resolution.

For sampling the high frequency 1000Base-T1 conform analog signals, the sampling frequency of the shared ADC 410 is accordingly configured, e.g. in response to the mode signal 405 indicative of the high data rate mode. The shared ADC 410 is operated as part of a pipeline analog-to-digital converter arrangement comprising the upstream ADC 310 and the shared ADC 410, which allows to sample the high frequency 1000Base-T1 conform analog signals at the required time and voltage resolution.

Figure 4:
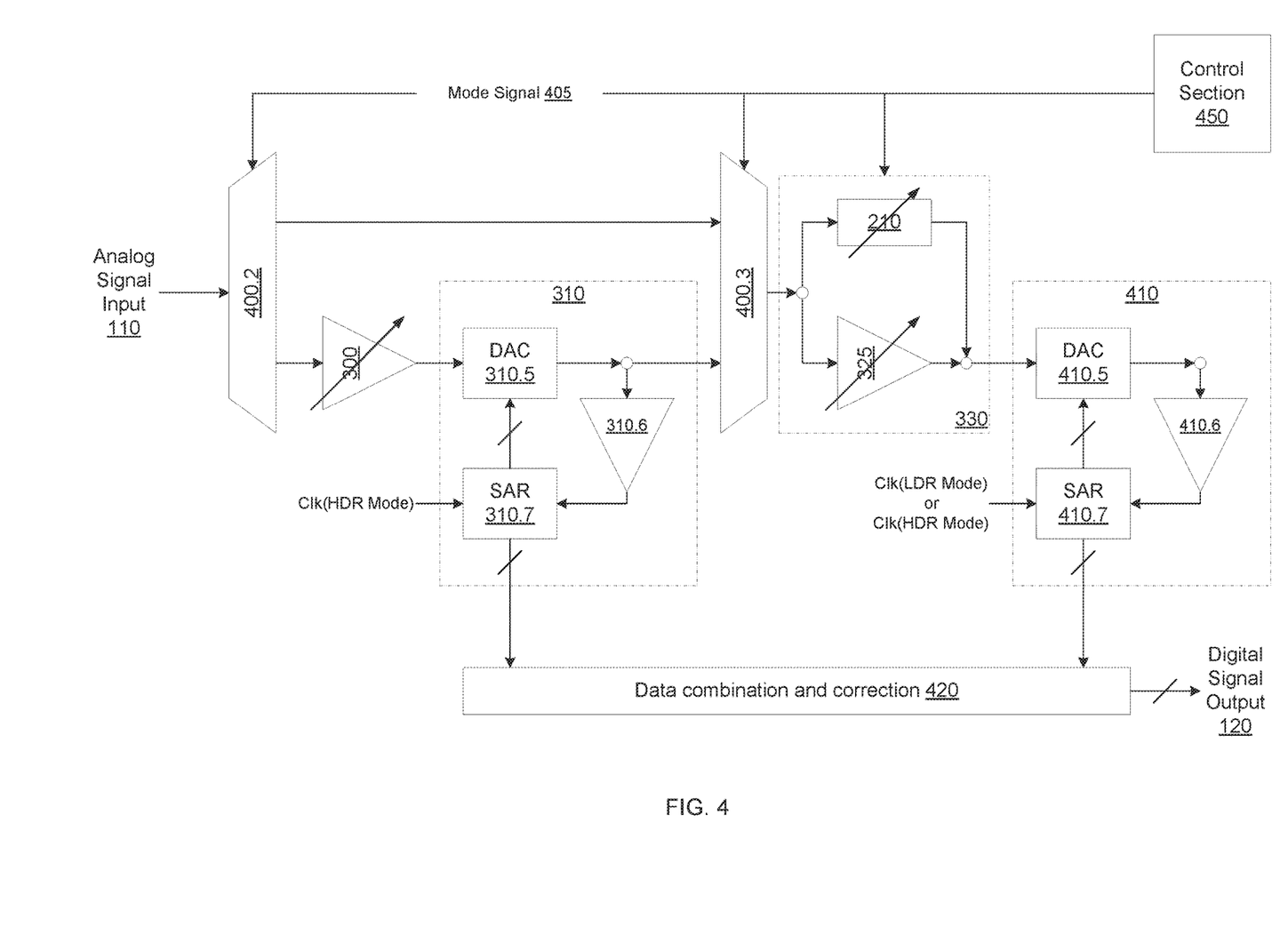
FIG. 4 schematically illustrates a block diagram of an analog front-end (AFE) of a receiver section of an Ethernet transceiver according to yet another example of the present invention.

Referring now to FIG. 4, a schematic block diagram of a further analog front-end, AFE, of a receiver section of an Ethernet transceiver according to embodiments of the present application is shown.

The exemplary analog front-end, AFE, shown herein comprises a programmable signal conditioning stage 330 and a shared ADC 410 implemented in form of a successive approximation (SA) analog-to-digital converter (ADC). The programmable signal conditioning stage 330 and the shared SA ADC 410 represent the components of the first, low data rate, signal path.

The exemplary analog front-end, AFE, shown herein further comprises a second signal-conditioning section 300, which is tunable, and an upstream ADC 310 implemented in form of a successive approximation (SA) analog-to-digital converter (ADC). The second signal-conditioning section 300, the upstream SA ADC 310, the programmable signal conditioning stage 330, and the shared SA ADC 410 represent the components of the second, high data rate, signal path.

The sampling frequency of the shared SA ADC 410 is configurable in response to the mode signal 405 indicative of either a first, low data rate (LDR), mode or a second, high data rate (HDR), mode. For instance, the mode signal 405 may be a bi-level signal or a multi-level signal, wherein at least two levels of the bi-level or multi-level signal are indicative of either one of the first, LDR mode and the second, HDR mode. The mode signal 405 may be provided by a control section 450.

Signal-path switching elements are arranged to selectively establish the signal flow along either one of the first signal path or the second signal path in response to the mode signal 405. Based on the mode signal 405, the signal-path switching elements operationally establish either the first signal path or the second signal path.

The signal-path switching elements comprise herein a 1 to 2 multiplexer 400.2. The 1 to 2 multiplexer 400.2 is arranged at the analog signal input 110 of the exemplary analog front-end, AFE. The 1 to 2 multiplexer 400.2 selectively couples the analog input signal to the programmable signal conditioning stage 330 or second signal-conditioning section 300.

The signal-path switching elements further comprises herein a 2 to 1 demultiplexer 400.3, which is arranged upstream to the programmable signal conditioning stage 330. The demultiplexer 400.3 couples the analog signal input 110 (via the 1 to 2 multiplexer 400.2) to programmable signal conditioning stage 330 and the upstream SA ADC 310 to programmable signal conditioning stage 330, respectively.

The upstream SA ADC 310 may comprise a DAC sub-section 310.5 with error signal output, a successive approximation register, SAR, sub-section 310.7 and an error signal amplifier sub-section 310.6. The DAC sub-section 310.5 accepts an analog signal and a digital signal and outputs an error signal, which results from the comparison of the input analog signal and a back-converted analog signal, which is equivalent to a current digital signal received from the SAR sub-section 310.7.

The error signal output by the DAC sub-section 310.5 is fed through the error signal amplifier sub-section 310.6 to the SAR sub-section 310.7 to allow for successive approximation of the digital signal with regard to the analog signal input into the DAC sub-section 310.5. The successive approximation performed by the upstream SA ADC 310 comprises B iterations, where B is the bit resolution of the SA ADC 310. The resolution of the SA ADC 310 and the SA ADC 410 may be different. The successive approximation operation is completed after B iterations.

The shared SA ADC 410 may be analogously implemented and may comprise a DAC sub-section 410.5 with error signal output, a successive approximation register, SAR, sub-section 410.7 and an error signal amplifier sub-section 410.6. The DAC sub-section 410.5 accepts an analog signal and a digital signal and outputs an error signal, which results from the comparison of the input analog signal and a back-converted analog signal, which is equivalent to a current digital signal received from the SAR sub-section 410.7. The error signal output by the DAC sub-section 410.5 is fed through the error signal amplifier sub-section 410.6 to the SAR sub-section 410.7 to allow for successive approximation of the digital signal with regard to the analog signal input into the DAC sub-section 410.5. The successive approximation performed by the shared SA ADC 410 comprises B' iterations, where B' is the bit resolution of the SA ADC 410. The successive approximation operation is completed after B' iterations. The resolution of the upstream SA ADC 310 and the shared SA ADC 410 may be different.

The shared SA ADC 410 is used for sampling input signals with different symbol rates, which may be obtained by controlling the sampling frequency of the shared SA ADC 410 in correspondence with the mode signal 405 indicative of the symbol rate of the input signal as described above. Those skilled in the art will understand that the above described shared SA ADC 410 is only one possibility to implement a shared ADC 410 adaptable to different input signal symbol rates. For instance, an alternative is a time-interleaved shared ADC.

A time-interleaved shared ADC 410 may for instances use M parallel sub-ADCs. Each sub-ADC samples an analog input signal every M-th cycle of an effective sample clock, e.g. the effective clock rate may be the multiple of M of a base sample rate. The result is that the sample rate is increased M times compared to what each individual sub-ADC can manage. For instance, one of the M parallel sub-ADCs is used for the first, LDR mode and the M sub-ADCs are used for the second, HDR mode. The analog input signal supplied to such a time-interleaved shared ADC 410 may be fed into a signal splitter, which is arranged to supply the analog input signal to each of the M parallel sub-ADCs. The sub-ADCs output the sampled digital signal time-interleaved, e.g. each sub-ADC outputs a sampled digital signal every M-th cycle of an effective sample clock. Alternative the analog input signal supplied to such a time-interleaved shared ADC 410 may be fed into a 1 to M switch, which is controlled on the basis of the effective sample clock for selectively feeding the analog input signal into a respective one of the M sub-ADCs. Each sub-ADC may be an SA ADC as described above.

The error signal output by the DAC sub-section 310.5, which remains after completion of the successive approximation operation performed by the SA ADC 310, is further supplied to the programmable signal conditioning stage 330 when the second signal path is established. The remaining error signal output by the DAC sub-section 310.5 is the residual error signal discussed above. The digital signal obtained after completion of the successive approximation operation performed by the SA ADC 310 is supplied to the digital combination and correction section 420.

Those skilled in the art will understand from the above description that the programmable signal conditioning stage 330 integrates and aforementioned signal conditioning section 200 and residual amplifier 320 and the functionalities thereof described above. In particular, the programmable signal conditioning stage 330 is configurable to perform the functionality of the signal conditioning section 200 and to perform the functionality of the residual amplifier 320. The components of the programmable signal conditioning stage 330 may be considered to be associated to the respective power domain PD1 or PD2, which will be more fully understood from the following description referring to FIGS. 5a and 5b.

Figure 5A:
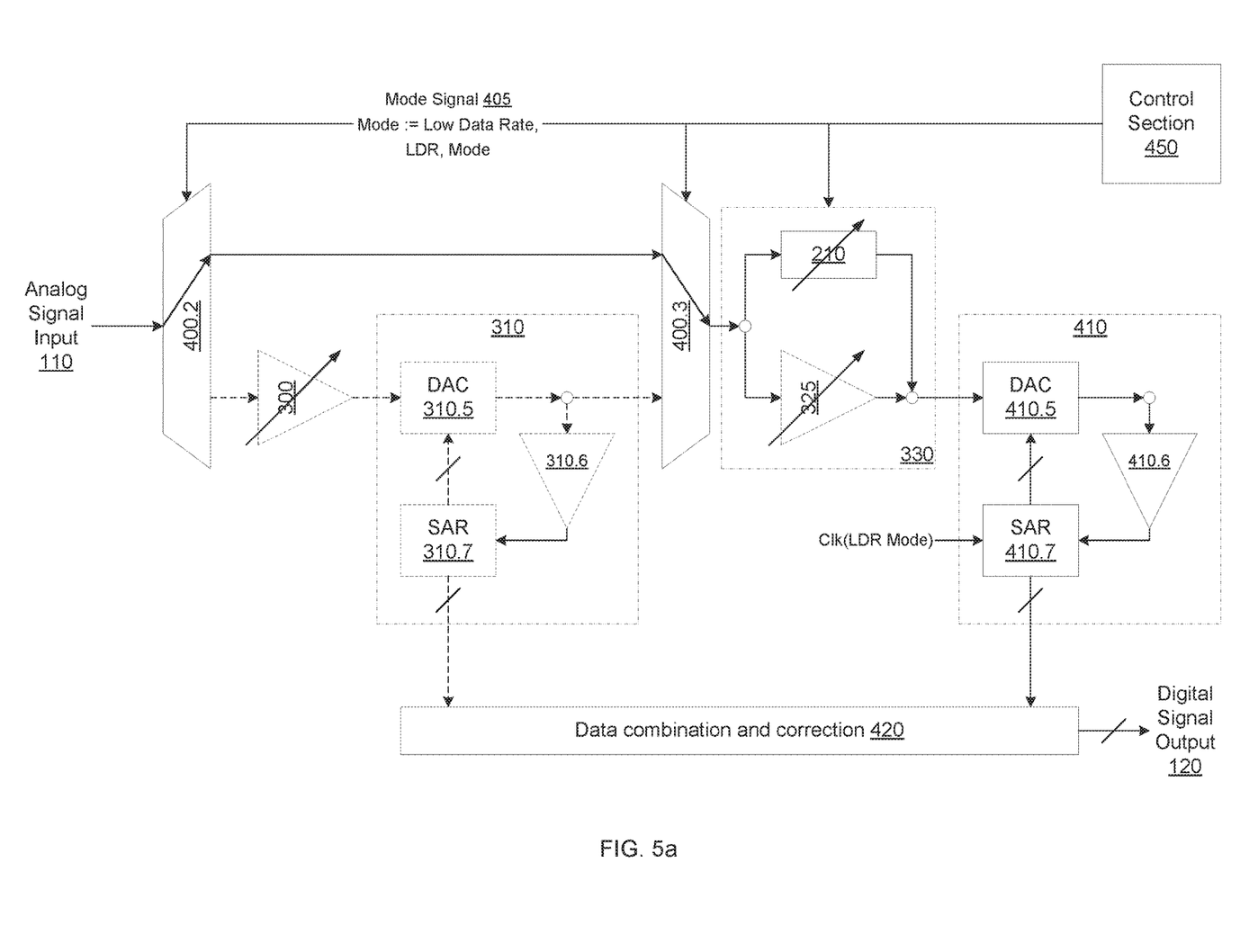
FIGS. 5a and 5b schematically illustrate block diagrams of the exemplary analog front-end (AFE) of FIG. 4 operated in different modes according to another example of the present invention.
Figure 5B:
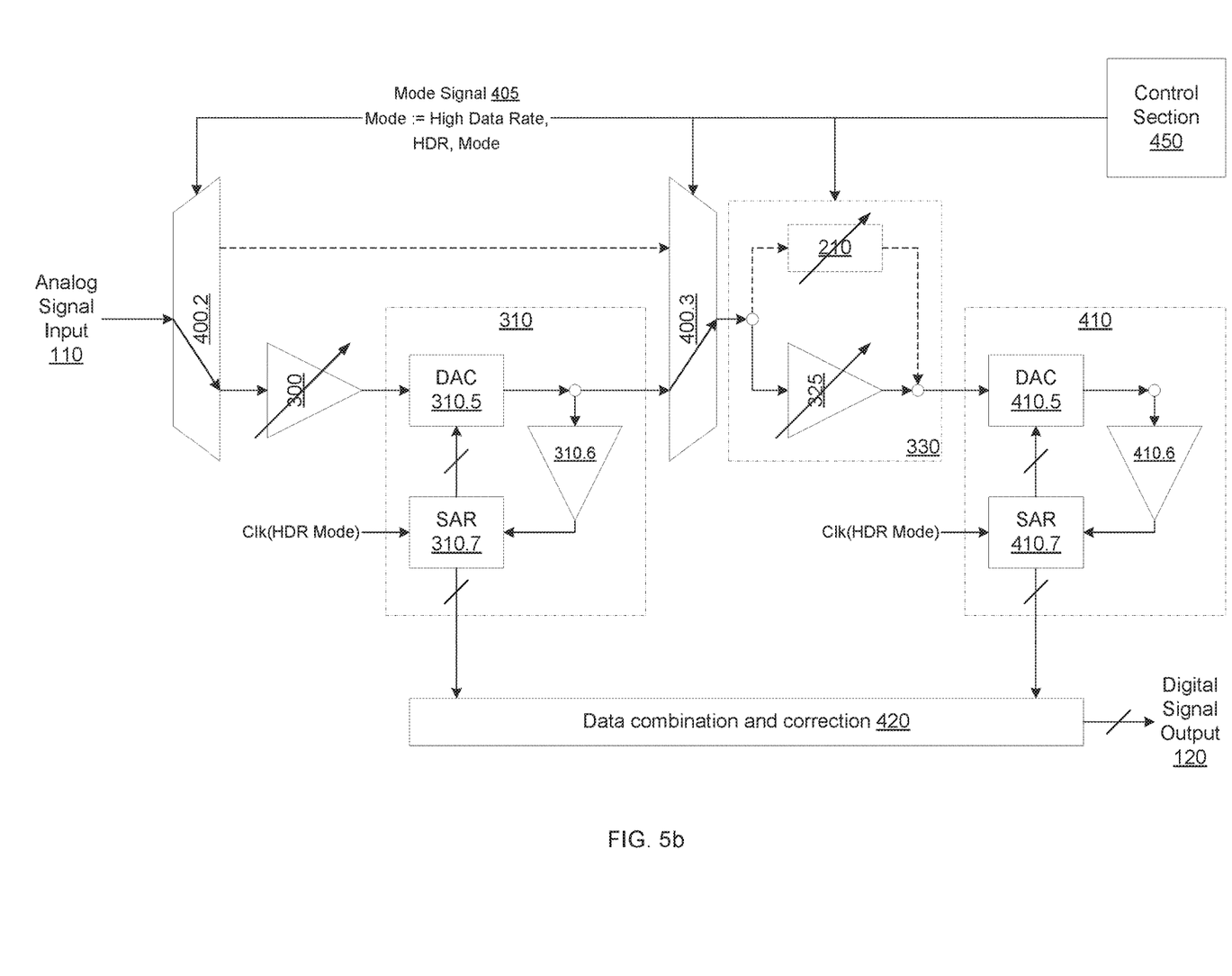

Referring now to FIGS. 5a and 5b, the switched signal paths are schematically illustrated with respect to the example implementation of FIG. 4. Notwithstanding, the invention is not limited in this regard.

Referring now to FIG. 5a, the signal-path switching elements, herein the 1 to 2 multiplexer 400.2 and the 2 to 1 demultiplexer 400.3, are controlled by the mode signal indicative of the first, LDR mode to operationally establish (activate) the flow of the analog input signal along the first, low data rate, signal path.

The analog input signal supplied to the analog signal input 110 flows along the first signal path to the programmable signal conditioning stage 330 in accordance with the switching state of the signal-path switching elements. At the same time, analog signal flow along the second signal path is inhibited.

The programmable signal conditioning stage 330 is arranged to control the signal swing and/or the signal amplitude at the input of the downstream-arranged shared SA ADC 410. The programmable signal conditioning stage 330 comprises for instance a filter 210 and/or an input amplifier 325. In particular, the filter 210 may be an anti-alias receive filter or a bandpass input filter. The input amplifier 325 may be a programmable gain input amplifier, PGA. More particularly, the filter 210 may be a tunable RC filter. The programmable signal conditioning stage 330 is configurable based on the mode signal in particular to allow for conditioning 100Base-T1 conform analog signals received at the analog signal input 110. In an example, the filter 210 and the input amplifier 325 are operated for conditioning 100Base-T1 conform analog signals. In another example, only the filter 210 is operated for conditioning 100Base-T1 conform analog signals.

The conditioned analog input signal is supplied to the shared SA ADC 410. In accordance with the mode signal 405 indicative of the first, LDR mode, the shared SA ADC 410 is controlled to operate at a low sampling frequency corresponding to the data rate of the conditioned analog input signal. In particular, the sampling frequency of the shared SA ADC 410 is controlled to match with the rate of symbols carried by the analog input signal. For instance, the control section 450 is arranged to control the sampling frequency of the shared SA ADC 410 in correspondence with the mode signal 405. In case of 100Base-T1 conform analog signals the sampling frequency of the shared SA ADC 410 is controlled at a sampling frequency of 80 MSps, mega-samples per second, to meet the 66⅔ MHz symbol transmission rate of 100Base-T1 conform analog signals.

The digital signal output by the shared ADC 410 is a digital representation of the conditioned analog input signal processed on the first, low data rate, signal path. The digital signal is supplied by the shared SA ADC 410 to the digital combination and correction section 420, which in case of the mode being in the low data rate mode is arranged to buffer the digital signal for forwarding to the digital back end of the receiver section of the Ethernet transceiver for further processing thereat.

As already mentioned above, the second, high data rate, signal path is deactivated. Accordingly, the components arranged only in the second, high data rate, signal path may be unpowered because they are not required for the operation of the analog front-end 100 in the current low data rate mode. In particular, the second signal-conditioning section 300 and the upstream SA ADC 310, which are arranged in the power domain PD2, are unpowered for power consumption efficiency. The input amplifier 325 may be also unpowered when not required for conditioning the analog input signal.

Referring now to FIG. 5b, the signal-path switching elements are controlled to operationally establish (activate) the flow of the analog input signal along the second, high data rate, signal path.

The analog input signal supplied to the analog signal input 110 flows along the second signal path to the second signal-conditioning section 300 in accordance with the switching state of the signal-path switching elements controlled by the mode signal 405 indicative of the second, HDR mode. At the same time, analog signal flow along the first signal path is inhibited. The second signal-conditioning section 300 is arranged to control the signal swing at the input of the upstream ADC 310. The second signal-conditioning section 300 comprises for instance a filter and/or an input amplifier. In particular, the filter may be an anti-alias receive filter or a bandpass input filter and/or the input amplifier may be a programmable gain input amplifier, PGA. The second signal-conditioning section 300 is in particular adapted for conditioning 1000Base-T1 conform analog signals received at the analog signal input 110.

The conditioned analog input signal is supplied to the upstream SA ADC 310. The upstream SA ADC 310 is configured to operate at a high sampling frequency corresponding to a high data rate signal. In particular, the sampling frequency of the upstream SA ADC 310 is configured to match with the rate of symbols carried by the analog input signal. In case of 1000Base-T1 conform analog signals the sampling frequency of the shared ADC 410 is configured at a sampling frequency of 800 MSps, mega-samples per second, to meet the 750 MHz symbol transmission rate of 1000Base-T1 conform analog signals.

The residual error signal output by the upstream SA ADC 310 is supplied to the programmable signal conditioning stage 330 arranged upstream to the shared SA ADC 410. The programmable signal conditioning stage 330 is configured to operate as an amplifier for the residual error signal. The gain of the amplifier 325 of the programmable signal conditioning stage 330 is adjusted to amplify the residual error signal to be in correspondence with the signal input range of the shared ADC 410. The programmable signal conditioning stage 330 is configured to operate as a residual amplifier as described above with reference to the residual amplifier 320. The adjusting of the amplifier 325 of the programmable signal conditioning stage 330 is for instance controlled on the basis of mode signal 405 indicative of the second, HDR mode supplied to the programmable signal conditioning stage 330.

The amplified residual error signal is supplied to the shared SA ADC 410. In accordance with the mode signal 405, the shared SA ADC 410 is controlled to operate at the high sampling frequency corresponding to the high data rate signal. In particular, the sampling frequency of the shared SA ADC 410 is controlled to match with the rate of symbols carried by the analog input signal. For instance, the control section 450 is arranged to control the sampling frequency of the shared SA ADC 410 in correspondence with the mode signal 405. In case of 1000Base-T1 conform analog signals the sampling frequency of the shared ADC 410 is controlled at a sampling frequency of 800 MSps, mega-samples per second, to meet the 750 MHz symbol transmission rate of 1000Base-T1 conform analog signals.

The digital signals output by the upstream SA ADC 310 and the shared SA ADC 410 are digital representations of the conditioned analog input signal processed on the second, high data rate, signal path. The digital signals are supplied by the upstream SA ADC 310 and the shared SA ADC 410 to the digital combination and correction section 420, which in case of the mode being in the high data rate mode is arranged to combine the digital signals to one digital signal representative of the actual analog input signal.

The digital signal generated by digital combination and correction section 420 on the basis of the digital signals (received from the upstream SA ADC 310 and the shared SA ADC 410 in case of the mode being in the high data rate mode) is further forwarded to the digital back end of the receiver section of the Ethernet transceiver for further processing thereat.

As already mentioned above, the first, low data rate, signal path is deactivated. Accordingly, the components arranged only with the first, low data rate, signal path can be unpowered because they are not required for the operation of the analog front-end 100 in the current high data rate mode. In particular, the filter 210 of the programmable signal conditioning stage 330 may be unpowered for power consumption efficiency. The filter 210 of the programmable signal conditioning stage 330 may be associated with the power domain PD1.

According to an example of the present application, a reconfigurable analog front-end circuit is provided, which comprises an analog signal input for receiving an analog input signal, an optional first signal-conditioning section, an optional second signal-conditioning section, an upstream analog-to-digital converter (ADC), a shared analog-to-digital converter (ADC), at least one signal-path switching element, and a digital signal output for outputting a digital output signal, which is a digital representation of the analog input signal. The circuit is reconfigurable using the at least one signal-path switching element controlled by a mode signal, which is indicative of one of a first mode and a second mode. In response to the mode signal indicative of the first mode, a first signal path is selectively switched by the at least one signal-path switching element and the analog input signal received at the analog signal input flows along the first signal path, which comprises the optional first signal-conditioning section and the shared ADC. In response to the mode signal indicative of the second mode, a second signal path is selectively switched by the at least one signal-path switching element and the analog input signal received at the analog signal input flows along the second signal path, which comprises the optional second signal-conditioning section, the upstream ADC and the shared ADC.

According to an example of the present application, the circuit further comprises a power domain comprising a second signal-conditioning section being part of the second signal path and the upstream ADC. In response to the mode signal indicative of the second mode, components comprised by the second power domain are unpowered.

According to an example of the present application, the shared ADC has a configurable sampling frequency. The sampling frequency of the shared ADC is set in response to the mode signal.

According to an example of the present application, the circuit further comprises a signal amplifier coupled to the upstream ADC arranged to receive a residual signal and configured to amplify the received residual signal. The amplified residual signal is provided to be supplied to the shared ADC.

According to an example of the present application, the circuit further comprises a programmable signal conditioning stage, which is configured to selectively operate as a first signal conditioning section and a residual signal amplifier in response to the mode signal. The programmable signal conditioning stage is part of the first signal path and the second signal path. In an example, the programmable signal conditioning stage comprises a filter and a signal amplifier, which are in particular selectively configurable in response to the mode signal. In an example, the components of the programmable signal conditioning stage can be unpowered selectively.

According to an example of the present application, the at least one signal-path switching element comprises a multiplexer and a demultiplexer, which are configured to selectively switch the first signal path and the second signal path in response to the mode signal. The multiplexer is arranged to receive the analog signal input and configured to selectively supply the analog signal input to the demultiplexer and the upstream ADC. The demultiplexer is arranged to receive the analog signal input from the multiplexer and a residual signal from the upstream ADC and to selectively supply the received signal to the shared ADC.

According to an example of the present application, the circuit further comprises a data combination section coupled to the upstream ADC and the shared ADC and configured to receive digital signals from the ADCs and to provide the digital output signal representative of the analog input signal to the digital signal output.

According to an example of the present application, in response to the mode signal indicative of the second mode, the upstream ADC is configured to generate a first part of the digital output signal and the shared ADC is configured to generate a part of the digital output signal. The first and the second parts are digital representations of different value ranges of the analog input signal. The data combination section is configured to combine the first and the second parts to obtain the digital output signal representative of the analog input signal.

According to an example of the present application, the circuit further comprises in response to the mode signal indicative of the first mode, the shared ADC is configured to generate the digital output signal.

According to an example of the present application, the at least one signal-path switching element comprises a multiplexer, which switching state is controlled in response to the mode signal. In an example, the at least one signal-path switching element comprises a demultiplexer, which switching state is controlled in response to the mode signal According to an example of the present application, the upstream ADC is a successive approximation ADC. According to an example of the present application, the shared ADC is a successive approximation ADC (410).

According to an example of the present application, the first mode is a low data rate mode for processing analog signal carrying data with a low data along the first signal path. The second mode is a high data rate mode for processing analog signal carrying data with a high data along the first signal path.

According to an example of the present application, the circuit operated in the first mode is configured for processing 100Base-T1 conform analog signals. The circuit operated in the second mode is configured for processing 1000Base-T1 conform analog signals.

According to an example of the present application, a reconfigurable Ethernet transceiver is provided, which comprises an aforementioned analog front-end circuit. According to an example of the present application, the reconfigurable Ethernet transceiver, which is in particular an automotive reconfigurable Ethernet transceiver, supports at least 100Base-T1 and 1000Base-T1 communication standards.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible. The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

In the figures:
- 100: analog front-end (AFE);
- 110: analog signal input for an analog input signal;
- 120: digital signal output for a digital output signal;
- 200: first signal-conditioning section;
- 210: filter;
- 300: second signal-conditioning section;
- 310: upstream analog-to-digital converter (ADC);
- 310.1: analog-to-digital converter (ADC) sub-section;
- 310.2: digital-to-analog converter (DAC) sub-section;
- 310.3: analog signal subtractor sub-section;
- 310.5 digital-to-analog converter (DAC) sub-section with residual signal output;
- 310.6: error signal amplifier sub-section;
- 310.7: successive approximation register (SAR) sub-section;
- 320: residual signal amplifier;
- 325: amplifier;
- 330: programmable signal conditioning stage
- 400.1: t2 to 1 multiplexer/signal-path switching element;
- 400.2: 1 to 2 multiplexer/signal-path switching element;
- 400.3: 2 to 1 demultiplexer/signal-path switching element;
- 405: mode signal;
- 410: shared analog-to-digital converter (ADC);
- 410.5 digital-to-analog converter (DAC) sub-section;
- 410.6: error signal amplifier sub-section;
- 410.7: successive approximation register (SAR) sub-section;
- 420: digital combination and correction section 420; and
- 450: control section.

The invention claimed is:

1. A reconfigurable analog front-end circuit, comprising:
an analog signal input for receiving an analog input signal;
an upstream analog-to-digital converter (ADC);
a shared ADC;
at least one signal-path switching element; and
a digital signal output for outputting a digital output signal, which is a digital representation of the analog input signal, wherein the circuit is reconfigurable using the at least one signal-path switching element controlled by a mode signal, which is indicative of one of a first mode and a second mode, wherein in response to the mode signal indicative of the first mode,
  a first signal path is selectively switched by the at least one signal-path switching element and
  the analog input signal received at the analog signal input flows along the first signal path, which comprises the shared ADC and a sampling frequency of the shared ADC is set at a first value, wherein in response to the mode signal indicative of the second mode,
  a second signal path is selectively switched by the at least one signal-path switching element and
  the analog input signal received at the analog signal input flows along the second signal path, which comprises the upstream ADC and the shared ADC and the sampling frequency of the shared ADC is set at a second value.

2. The circuit according to claim 1, further comprising:
  a power domain comprising a second signal-conditioning section being part of the second signal path and the upstream ADC,
wherein in response to the mode signal indicative of the second mode, the components comprised by the power domain are unpowered.

3. The circuit according to claim 1,
  wherein the shared ADC has a configurable sampling frequency;
  wherein the sampling frequency of the shared ADC is set in response to the mode signal.

4. The circuit according to claim 1, further comprising:
  a signal amplifier coupled to the upstream ADC, arranged to receive a residual signal and configured to amplify the received residual signal,
wherein the amplified residual signal is provided to be supplied to the shared ADC.

5. The circuit according to claim 1, further comprising:
  a programmable signal conditioning stage configured to selectively operate as a first signal conditioning section and a residual signal amplifier in response to the mode signal,
wherein the programmable signal conditioning stage is part of the first signal path and the second signal path.

6. The circuit according to claim 5,
  wherein in response to the mode signal indicative of the second mode, the upstream ADC is configured to generate a first part of the digital output signal and the shared ADC is configured to generate a part of the digital output signal,
  wherein the first and the second parts are digital representations of different value ranges of the analog input signal,
  wherein the data combination section is configured to combine the first and the second parts to obtain the digital output signal representative of the analog input signal.

7. The circuit according to claim 5,
  wherein in response to the mode signal indicative of the first mode, the shared ADC is configured to generate the digital output signal.

8. The circuit according to claim 1,
  wherein the at least one signal-path switching element comprises a multiplexer and a demultiplexer, which are configured to selectively switch the first signal path and the second signal path in response to the mode signal,
  wherein the multiplexer is arranged to receive the analog signal input and configured to selectively supply the analog signal input to the demultiplexer and the upstream ADC,
  wherein the demultiplexer is arranged to receive the analog signal input from the multiplexer and a residual signal from the upstream ADC and to selectively supply the received signal to the shared ADC.

9. The circuit according to claim 1, further comprising:
  a data combination section coupled to the upstream ADC and the shared ADC and configured to receive digital signals from the ADCs and to provide the digital output signal representative of the analog input signal to the digital signal output.

10. The circuit according to claim 1,
  wherein the at least one signal-path switching element comprises a multiplexer.

11. The circuit according to claim 1,
  wherein the upstream ADC comprises a successive approximation ADC; and/or
  wherein the shared ADC comprises a successive approximation ADC.

12. The circuit according to claim 1,
  wherein the first mode is a low data rate mode for processing analog signal carrying data with a low data along the first signal path,
  wherein the second mode is a high data rate mode for processing analog signal carrying data with a high data along the first signal path.

13. The circuit according to claim 1,
  wherein the circuit operated in the first mode is configured for processing 100Base-T1 conform analog signals,
  wherein the circuit operated in the second mode is configured for processing 1000Base-T1 conform analog signals.

14. The reconfigurable Ethernet transceiver according to claim 13,
  wherein the reconfigurable Ethernet transceiver is an automotive Ethernet transceiver supporting at least 100Base-T1 and 1000Base-T1 communication standards.

15. A reconfigurable Ethernet transceiver, comprising:
  an analog front-end circuit according to claim 1.

16. A reconfigurable analog front-end circuit, comprising:
  an analog signal input for receiving an analog input signal;
  an upstream analog-to-digital converter (ADC);
  a shared ADC;
  at least one signal-path switching element; and
  a digital signal output for outputting a digital output signal, which is a digital representation of the analog input signal,
wherein the circuit is reconfigurable using the at least one signal-path switching element controlled by a mode signal, which is indicative of one of a first mode and a second mode,
wherein in response to the mode signal indicative of the first mode,
  a first signal path is selectively switched by the at least one signal-path switching element and
  the analog input signal received at the analog signal input flows along the first signal path, which comprises the shared ADC,
wherein in response to the mode signal indicative of the second mode, a second signal path is selectively switched by the at least one signal-path switching element; and the analog input signal received at the analog signal input flows along the second signal path, which comprises the upstream ADC and the shared ADC, wherein the at least one signal-path switching element comprises a multiplexer and a demultiplexer, which are configured to selectively switch the first signal path and the second signal path in response to the mode signal, wherein the multiplexer is arranged to receive the analog signal input and configured to selectively supply the analog signal input to the demultiplexer and the upstream ADC, wherein the demultiplexer is arranged to receive the analog signal input from the multiplexer and a residual signal from the upstream ADC and to selectively supply the received signal to the shared ADC.

* * * * *